United States Patent [19]

Koleske

[11] Patent Number: 5,155,143
[45] Date of Patent: Oct. 13, 1992

[54] CONFORMAL COATINGS CURED WITH ACTINIC RADIATION

[75] Inventor: Joseph V. Koleske, Charleston, W. Va.

[73] Assignee: Union Carbide Chemicals & Plastics Technology Corporation, Danbury, Conn.

[21] Appl. No.: 674,168

[22] Filed: Mar. 25, 1991

Related U.S. Application Data

[60] Continuation-in-part of Ser. No. 443,447, Nov. 30, 1989, Pat. No. 5,043,221, which is a division of Ser. No. 810,758, Dec. 19, 1985, abandoned.

[51] Int. Cl.⁵ ............... C08G 59/68; C08G 65/28; C08G 77/16
[52] U.S. Cl. ................. 522/31; 522/170; 522/75; 522/79; 528/26; 528/27
[58] Field of Search ........... 522/170, 31; 528/26, 528/27, 361

[56] References Cited

U.S. PATENT DOCUMENTS

| | | | |
|---|---|---|---|
| 2,890,194 | 6/1959 | Phillips et al. | 525/438 |
| 4,108,747 | 8/1978 | Crivello | 522/31 |
| 4,130,708 | 12/1978 | Friedlander | 522/172 |
| 4,179,400 | 12/1979 | Tsao et al. | 502/168 |
| 4,193,799 | 3/1980 | Crivello | 430/319 |
| 4,216,288 | 8/1980 | Crivello | 430/280 |
| 4,231,951 | 3/1981 | Smith et al. | 556/80 |
| 4,250,053 | 2/1981 | Smith | 522/25 |
| 4,250,203 | 2/1981 | Schlesinger et al. | 427/44 |
| 4,256,828 | 3/1981 | Smith | 522/31 |
| 4,297,401 | 10/1981 | Chern et al. | 428/1 |
| 4,333,998 | 6/1982 | Leszyk | 522/74 |
| 4,426,431 | 1/1984 | Harasta | 522/170 |
| 4,585,534 | 4/1986 | Pasternack | 522/31 |
| 4,593,051 | 6/1986 | Koleske | 522/170 |
| 4,599,401 | 6/1986 | Koleske | 528/405 |

FOREIGN PATENT DOCUMENTS 143120 5/1985 European Pat. Off. .

Primary Examiner—Marion E. McCamish
Assistant Examiner—Arthur H. Koeckert
Attorney, Agent, or Firm—W. K. Volles

[57] ABSTRACT

A photocurable composition based on a cycloaliphatic polyepoxide, a poly(tetramethylene oxide)polyol and photoinitiator; and a printed circuit board having as a conformal coating thereon, the cured product of the photocurable composition.

16 Claims, No Drawings

CONFORMAL COATINGS CURED WITH ACTINIC RADIATION

This application is a continuation-in-part of application Ser. No. 443,447, filed Nov. 30, 1989 now U.S. Pat. No. 5,043,221 which in turn is a division of application Ser. No. 810,758, filed Dec. 19, 1985, now abandoned.

BACKGROUND OF THE INVENTION

This invention pertains to polymer compositions curable by actinic radiation and more particularly to the use of mixtures of cycloaliphatic epoxides, polyols and onium salt photoinitiators for coating various metal, ceramic, glass, plastic, and composite substrates.

Prior art conventional conformal coatings comprise solutions of polymers or reactive components in a solvent. After application to a printed circuit board substrate, the solvent was removed by long time evaporation at room temperature or at an elevated temperature. When reactive components are involved, after mixture of two or more components, the systems had a relatively short pot life on the order of a few hours or less to about 24 hours.

Conformal coatings are coatings that encapsulate a printed circuit board and its components. This complete envelope of encapsulating material provides protection from humidity, moisture, dust, fungus, and other contaminants. In addition, properly applied conformal coatings enhance circuit reliability by eliminating current or voltage leakage from high impedance circuits. A paper by J. Waryold, of HumiSeal, entitled "How to Select a Conformal Coating for Printed Circuit Boards" describes conformal coatings. Section 4.7 of the book *Protective Circuit Coatings* describes the various types of materials that are used for conformal coatings.

A great deal of effort was expended on investigating the various cycloaliphatic epoxide materials as rapidly curable, ultra-violet light curable conformal coatings. Although curable coatings could be formed from many systems, they had electrical insulation values that only marginally passed the military specification requirements (i.e., they were about $2.5 \times 10^{12}$ ohms). In addition, when subjected to a humid environment, the electrical insulation values decreased to a level less than the requirements of the military specification. The resistance values of the coatings could be improved if a thermal post cure were employed, but this is less desirable than coatings that do not require a thermal post cure or only require a thermal post cure to achieve extremely high performance features which exceed the military specifications by a large amount.

U.S. Pat. No. 4,256,828 discloses information about photocurable compositions that contain epoxides, organic material with hydroxyl functionality and a photosensitive aromatic sulfornium or iodonium salt.

U.S. Pat. No. 4,216,288, U.S. Pat. No. 4,193,799 and U.S. Pat. No. 4,108,747 are concerned with photocurable compositions that can be used in the electronics industry as photoresists.

However, none of the patents listed above deal with conformal coatings.

It is therefore an object of this invention to provide coating compositions that are moisture resistant and have electrical insulation resistance greater than about $2.5 \times 10^{12}$ ohms when cured by exposure to actinic radiation, particularly ultra-violet light; and can be applied as conformal coatings to encapsulate or coat a printed circuit board and/or particular components of the printed circuit board.

SUMMARY OF THE INVENTION

A method of coating printed circuit boards, electrical components and other metal and plastic substrates, which meets the objects enumerated above, has been found which comprises contacting said substrates with a conformal coating composition consisting essentially of a predominant amount of a cycloaliphatic epoxide together with a polyether polyol, a photoinitiator and optionally a surfactant.

It is preferred to employ about 60 to about 89 parts of epoxide, about 10 to about 35 parts of polyether polyol, about 1 to about 5 parts of a photoinitiator and 0 to about 1 part of a surfactant, all parts being by weight.

Further, such cycloaliphatic epoxides may be blended with the blends of cycloaliphatic epoxides and other epoxides described infra. These epoxides are well known in the art and many are commercially available.

Suitable cycloaliphatic epoxide resins for purposes of this invention are those having an average of one or more epoxy groups per molecule. Preferably the cycloaliphatic epoxide resing will be a mixture of epoxides that will usually contain a major proportion of cycloaliphatic epoxides that contain two or more epoxy groups per molecule. Illustrative of suitable cycloaliphatic epoxides are the following:

FORMULA I

Diepoxides of cycloaliphatic esters of dicarboxylic acids having the formula:

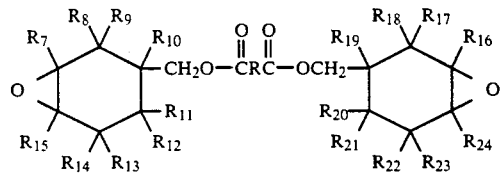

wherein $R_7$ through $R_{24}$ can be the same or different, are hydrogen or alkyl radicals generally containing one to nine carbon atoms inclusive, and preferably containing one to three carbon atoms, inclusive, as for example methyl, ethyl, n-propyl, n-butyl, n-hexyl, 2-ethylhexyl, n-octyl, n-nonyl and the like; R is a valence bond or a divalent hydrocarbon radical generally containing one to twenty carbon atoms, inclusive, and preferably, containing four to six carbon atoms, inclusive, as for example, alkylene radicals, such as trimethylene, tetramethylene, pentamethylene, hexamethylene, 2-ethylhexamethylene, octamethylene, nonamethylene, hexadecamethylene and the like; cycloaliphatic radicals, such as 1,4-cyclohexane, 1,3-cyclohexane, 1,2-cyclohexane, and the like.

Particularly desirable epoxides falling within the scope of Formula I, are those wherein $R_1$ through $R_{18}$ are hydrogen and R is alkylene containing four to six carbon atoms.

Among specific diepoxides of cycloaliphatic esters of dicarboxylic acids are the following:
bis(3,4-epoxycyclohexylmethyl)oxalate,
bis(3,4-epoxycyclohexylmethyl)adipate,
bis(3,4-epoxy-6-methylcyclohexylmethyl)adipate
bis(3,4-epoxycyclohexylmethyl)pimelate, and the like.

Other suitable compounds are described in, for example, U.S. Pat. No. 2,750,395.

FORMULA II

A 3,4-epoxycyclohexylmethyl 3,4-epoxycyclohexane carboxylate having the formula:

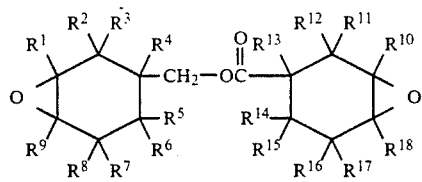

wherein $R^1$ through $R^{18}$ which can be the same or different are as defined for $R_7$ to $R_{24}$ in Formula I. A particularly desirable compound is one wherein $R^1$ through $R^{18}$ are hydrogen.

Among specific compounds falling within the scope of Formula II are the following: 3,4-epoxycyclohexylmethyl 3,4-epoxycyclohexane carboxylate; 3,4-epoxy-1-methylcyclohexylmethyl 3,4-epoxy-1-methylcyclohexane carboxylate; 6-methyl-3,4-epoxycyclohexylmethyl-6-methyl 3,4-epoxycyclohexane carboxylate; 3,4-epoxy-3-methylcyclohexylmethyl 3,4-epoxy-3-methylcyclohexane carboxylate; 3,4-epoxy-5-methylcyclohexylmethyl 3,4-epoxy-5-methylcyclohexane carboxylate. Other suitable compounds are described in, for example, U.S. Pat. No. 2,890,194.

FORMULA III

Diepoxides having the formula:

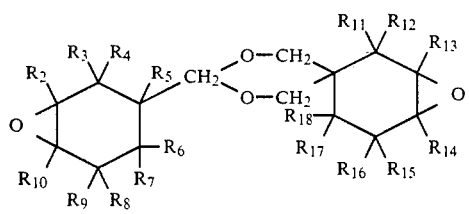

wherein the R's, which can be the same or different, are monovalent substituents such as hydrogen, halogen, i.e. chlorine, bromine, iodine or fluorine, or monovalent hydrocarbon radicals, or radicals as further defined in U.S. Pat. No. 3,318,822. A particularly, desirable compound is one wherein all the R's are hydrogen.

MONOEPOXIDES

The composition may include a cycloaliphatic monoepoxide that functions as a reactive diluent. This monoepoxide may be unsubstituted as cyclohexene oxide or substituted with alkyl of 1 to 9 carbon atoms, halogen, oxygen, ether, ester or vinyl radicals. Examples of substituted monoepoxides include alpha-pinene monoepoxide, limonene monoepoxide, 4-vinyl cyclohexane monoepoxide, norbornene monoepoxide, and the like. Preferably, the substituted monoepoxide is a vinyl substituted cycloaliphatic monoepoxide and is preferably selected from one or more of the following:

(1) 4-vinyl cyclohexane monoepoxide having the formula:

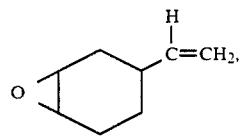

(2) norbornene monoepoxide having the formula:

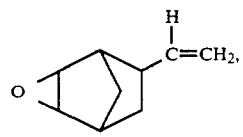

or (3) limonene monoepoxide having the formula:

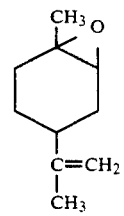

The cycloaliphatic monoepoxide may be used in the composition in amounts of from 0 to about 50, preferably from 1 to about 30, and most preferably from 2 to 20 weight percent of the cycloaliphatic epoxide used.

Other suitable cycloaliphatic epoxides are the following:

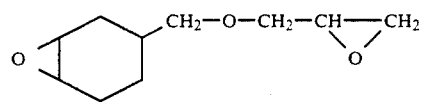

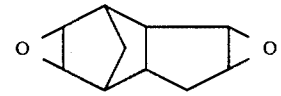

and the like.

The preferred cycloaliphatic epoxides are the following:

3,4-epoxycyclohexylmethyl 3,4-epoxycyclohexane carboxylate

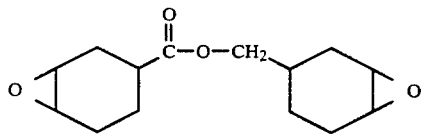

Bis(3,4-epoxycyclohexylmethyl)adipate

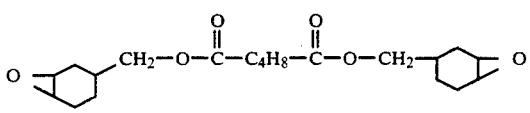

2-(3,4-epoxycyclohexyl-5,5-spiro-3,4-epoxy)cyclohexanemeta-dioxane

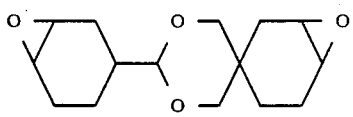

or mixtures thereof.

If desired, minor amounts of glycidyl epoxides such as the diglycidyl ethers of bisphenol-A, cresol-novolac epoxy resins, epoxy phenol novolac resins, diglycidyl ethers of 1,4-butanediol, and the like can be used.

The preferred polyether oxide polyols are dihydroxy functional poly(tetramethylene oxide)polyols having an average molecular weight of about 650 to about 3000 and an average hydroxyl number of about 35 to about 200. Other polyether polyols can be used alone or in combination with dihydroxy functional polytetramethylene oxide polyols. Examples of such polyols are polypropylene oxide polyols, polymer/polyols, propylene oxide polyols that have been capped with ethylene oxide, hydroxyethylated and hydroxypropylated cellulose, cellulose acetate-butyrates, and the like. In addition, small amounts of 1 to 15% of polyester polyols such as poly(hexamethylene adipate), poly(ethylene adipate), poly(butylene adipate), polycaprolactone, and so on may be used to modify the properties of the coating.

The photoinitiators which may be used herein include aromatic onium salts of Group VIa elements as described in U.S. Pat. No. 4,058,400; aromatic onium salts of Group Va elements as described in U.S. Pat. No. 4,069,055; aromatic onium salts of Group VIa elements having an MF anion where M is selected from P, As, and Sb as described in U.S. Pat. No. 4,231,951; and aromatic iodonium complex salts and aromatic sulfonium complex salts as described in U.S. Pat. No. 4,256,828. Also included are metal fluoroborates and a complex of boron trifluoride as described in U.S. Pat. No. 3,379,653; aryldiazonium compounds as described in U.S. Pat. No. 3,708,296, and so on. Preferred photoinitiators include arylsulfonium complex salts of halogen-containing complex ions, and aromatic onium salts of Group IIIa, Va, VIa elements. Some of such salts are commerically available such as FX-512 (available from 3M Co.), UVE-1014 and UVE-1016 (available from General Electric Co.), and UVI-6990 and UVI-6974 (available from Union Carbide Corp.).

If desired, other photoinitiators such as sulfonium, sulfoxonium, iodonium and diazonium salts can be used.

The compositions of this invention are particularly useful as conformal coatings which are used in the electronics industry. They can be coated over an entire printed circuit board and its components to provide an encapsulated system that is protected from a variety of hostile environments. These environments include moisture or high humidity conditions, high temperature and humidity conditions, dust, ionic contaminates and fungus. In addition, the conformal coatings of this invention provide enhancement of electrical circuit reliability. The conformal coating may at times only cover portions of the printed circuit board as, for example, over only the solder connections which are usually found on the noncomponent side of the board. Or, the conformal coating may be coated onto individual components—as for example, onto an integrated circuit to provide resistance and protection against arcing or some other loss mechanism. Of course, the coating may be applied to both portions of the board and one or more or all components on the board.

The compositions of this invention are also unique as the cured products thereof can be burned cleanly, that is, without charring during repairing of the coated printed circuit board. Generally, a printed circuit board, which has a conformal coating, is repaired by burning through the conformal coating to the defective component using a soldering iron or hot flame device. The defective component is then removed manually; the old solder removed by a suction means; any coating residue at the edge of the burn area is removed by use of a solvent soaked swab; the new component is placed on the circuit board and soldered in place and finally, if desired, additional coating applied and cured.

Conformal coatings based on aromatic epoxides such as diglycidyl ether of 2,2-bis(p-hydroxyphenyl)propane, char when subjected to a burning operation. The result is the formation of unsightly and conductive residues which degrade the electrical properties of printed circuit boards.

DESCRIPTION OF THE INVENTION

The compositions of this invention provide high solids coating systems that are usually 100% solids in nature in that they need not contain an added volatile solvent. They are curable with actinic energy with ultraviolet radiation preferred. Properties are developed rapidly and cure is accomplished after the passage of seconds. Although it is not necessary to apply thermal energy after the application of actinic energy to complete cure, it may be advantageous to heat the exposed coating. The viscosity of many of the systems described herein is of such a low nature that the coating can be applied by a variety of application methods. However, the systems can be warmed if desired to improve flow and leveling characteristics, to obtain a thinner film than would be obtained with the system at room temperature. If desired, an inert solvent such as 1,1,1-trichloroethane, methylene chloride, carbon tetrachloride, FREONS, perchloroethylene, toluene, ethoxyethyl acetate, methyl amyl ketone, and so on can be added to decrease viscosity and/or flow and leaching characteristics. If necessary to increase the viscosity, fillers such as talc, silicas, etc., cellulose acetate butyrate or other cellulosics, polycaprolactone, vinyl polymers, etc., may be added.

The systems contain one or more cycloaliphatic epoxides, one or more polyols of the poly(tetramethylene oxide)-type—although propylene oxide polyols can be used or added to the mixture as well as minor amounts of ester-containing polyols, an onium salt photoinitiator such as UVE-1014—although other sulfonium, sulfoxonium, iodonium, and diazonium photoinitiators can be used. Commercial examples of onium salt photoinitiators include UVE-1014 (GE), UVE-1016 (GE), FC-508 (3M), FC-509 (3M), and FX-512 (3M), UVI-6974 (UCC), and UVI-6990 (UCC). In addition, the formulated systems may contain a surfactant of the silicone, silicone copolymer, or fluorochemical-type. Polymeric acrylics such as Modaflow TM (Monsanto) can also be employed for good flow and leveling. A fluorescent chemical (often called a dye) such as Calcafluor White RWP (American Cyanamid) may be included in the formulation if desired. A dye such as this allows the coated article to be examined with what is often termed "black light" but really is a form of low intensity ultraviolet light. If desired, the polyol can be omitted from the formulation although in the preferred case it would be included.

The amount of polyol in the system is from 0 to 50%, with the preferred amount from 5 to 40%, and the most preferred amount from 10 to 35%.

The photoinitiator is present in an amount of 0.5% to 25% with the preferred amount 1% to 8% and the most preferred amount from 1% to 5%.

The surfactant is usually present in an amount of from 0.05% to 1.0% with the preferred amount from 0.1% to 0.6%. As is known to those skilled in the art, the amount of surfactant used will depend on the particular formulation and the particular surfactant chosen.

When present in the system, the fluorescent dye is usually present in an amount of 0.01% or less to 0.1% or more with the preferred amount 0.01% to 0.05%.

If desired, more than one poly(tetramethylene oxide)-polyol can be used in the system. In addition, various epoxides can be used in the system. These include ERL-4221, ERL-4299, ERL-4234, ERL-4206, as well as other di-, mono-, and trifunctional cycloaliphatic epoxides. Glycidyl epoxides of various types can also be used. Minor amounts of other polyols, such as caprolactone polyols, polyester polyols, poly(alkylene oxide) polyols, styrene/allyl alcohol copolymers, vinyl alcohol/vinyl acetate copolymers and other hydroxyl functional materials can be used. If desired, minor amounts of monohydroxyl functional materials may be included in the compositions. These include alcohols such as methanol, ethanol, propanol, butanol, pentanol, etc., hydroxyethyl acrylate and methacrylate, hydroxypropyl acrylate and methacrylate, alkylene oxide derivatives of hydroxylbearing acrylates and methacrylates, caprolactone derivatives of acrylates and methacrylates.

The actinic radiation that can be used is of various types, such as X-ray, gamma-ray, ultraviolet, electron beam, and the like.

The invention is further described in the Examples which follow. All parts and percentages are by weight unless otherwise specified.

GENERAL PROCEDURE FOR MIXING OF INGREDIENTS GIVEN IN THE VARIOUS EXAMPLES

The coating systems were prepared by placing the ingredients in amber-colored, glass bottles and stirring well. Before the POLYMEG TM polyols were added to the bottles they were warmed to liquefy the polyols and thus facilitate the solution or mixing process. In all cases, the solutions were cooled to room temperature before application to the test printed circuit boards (PCB) or metal substrates. The test PCB's were obtained from Nova Tran Corporation, #8340, H2, AW 185-0014-00 and B 190-0024-00. They were of the type that are described in FIG. 1 of MIL-I-46058C. These formulated systems were then applied and cured as described in the working examples. In the examples, amounts are in grams unless otherwise indicated.

EXAMPLES 1-7

The general procedure for mixing was used. Proportions are given in Tables I and II. On steel panels, the coating rapidly developed acetone resistance (>100 double rubs had no effect <5 hours after UV exposure), had good hardness, and poor adhesion. These coatings did not pass the conical mandrel test, although the one with Polymeg 2000 had only minor failure. On PCB's without a thermal post cure, the coatings developed good electrical resistance with all systems being within the desired range after 1-2 days ambient post cure. Note that 30 minutes after UV exposure, Example 1 had a resistance greater than that required by the specification (i.e., $3.2 \times 10^{12}$ ohms vs. a requirement of $2.5 \times 10^{12}$ ohms).

Table II contains formulation information for Examples 4-7 which were designed to have improved flexibility as measured by the mandrel bend test. One hour after UV exposure, all 12 coated boards had resistance values markedly $>2.5 \times 10^{12}$ ohms. After 3 days at RT, three of the systems developed resistances $>10^{14}$ ohms; and all coatings had resistances of $>10^{14}$ ohms when post cured for 30 minutes at 120° C. or 140° C.

To simulate the humidity cycling of Method 106 of Mil. Std. 202, a simple test apparatus was devised. Method 106 calls for cycling the board between 25° C. and 65° C. under relative humidities of 80-98% at the low temperature and 90-98% at the high temperature. During this cycling, the test specimen was taken from 25° C. to 65° C. over 2.5 hours, kept at 65° C. for 3 hours, dropped to 25° C. and raised to 65° C. over five hours, and kept at 65° C. for three hours. Then, during the remainder of the 24-hour test period, the board was brought to 25° C. and evaluated. The conditions are specified to be non-moisture-condensing. The board was subjected to 10 of these daily cycles and then given a final evaluation for insulation resistance characteristics.

To simulate this test, a Soxhlet extractor was modified so that the PCB did not contact the raising liquid in the condensation chamber. It did contact the 100% RH, condensing moisture environment at a temperature of about 90° C.

TABLE I

Polymeg/Epoxide Systems UV Cure

| Ingredients | Example 1 | Example 2 | Example 3 |
|---|---|---|---|
| Polymeg* 650 | 10.0 | — | — |
| Polymeg* 1000 | — | 7.0 | — |
| Polymeg* 2000 | — | — | 5.0 |
| ERL-4221 | 75.2 | 77.8 | 79.5 |
| VCHM | 12.3 | 12.7 | 13.0 |
| UVE-1014 | 2.0 | 2.0 | 2.0 |
| FC-171 | 0.5 | 0.5 | 0.5 |
| L-5410+ | 0.5 | 0.5 | 0.5 |
| Dye** (pph) | 0.02 | 0.02 | 0.02 |
| Properties | | | |
| Viscosity, cp | 75 | 80 | 95 |
| Temperature, °C. | 23.5 | 23.5 | 23.5 |

*Polymeg - Trademark for poly(tetramethylene oxide) polyols (Quaker Oats)
**Fluorescent dye, Calcafluor White RWP (American Cyanamid)
+The formulations with FC-171 did not exhibit good wettability, flow, and leveling. When the L-5410 was added, smooth coatings were obtained.

Coating/Cure System

It was necessary to melt the Polymeg 1000 and 2000 to effect solution. The systems were coated onto Bonderite 37 steel panels and onto fiberglass/epoxy printed circuit board (PCB) test panels. The steel panels were coated with a No. 20 wire-wound rod and the PCB's by a dip coating technique using about a 2-minute removal time. During cure, the relative humidity was 36% and the temperature 76° F. Cure rate for the steel panels was 10 fpm under a focused beam, 300 w/i, Type A, Fusion Systems light source. The PCB's were first cured on each side at a rate of 50 fpm and then twice on each side at 10 fpm. The PCB met MIL-I-46058C, 1982.

RESULTS

Systems 1-3 on Steel:

All coatings were tack-free, smooth, and had high gloss immediately after UV exposure. Thickness: 0.70 mil.

Systems 1-3 on PCB's:

Systems were tack-free after UV exposure. Thickness: 2-2.5 mils.

| Properties, One Day After Cure | Properties System, On Steel, No Post Cure | | |
|---|---|---|---|
| | 1 | 2 | 3 |
| Acetone Double Rubs* | 100(1) | 100(1) | 100(1) |
| Pencil Hardness | H | H | H |
| % Crosshatch Adhesion | 0 | 0 | 0 |
| Conical Mandrel** | Fail | Fail | 5 mm |
| Gardner Impact | | | |
| Face, in lbs. | 25 | 25 | 25 |
| Reverse, in lbs. | <5 | <5 | <5 |

*5 hours after UV exposure.
**ASTM D-522-60; failure indicates failure along entire length. A distance indicates length of failure from ⅛ inch end.

| Electrical Resistance (500 v impressed), ohm × 10⁻¹² | System, On PCB, No Post Cure | | |
|---|---|---|---|
| | 1 | 2 | 3 |
| After: | | | |
| 30 minutes | 3.2 | 1.4 | 0.8 |
| 16 hours | 2.8 | 1.4 | 3.1 |
| 2 days | 4.1 | 2.1 | 3.8 |
| 5 days | 12 | 7.5 | 3.8 |
| 12 days | 12 | 5.5 | 14 |

TABLE II

| | Polymeg/Epoxide Systems UV Cure | | | |
|---|---|---|---|---|
| | Example | | | |
| | 4 | 5 | 6 | 7 |
| Ingredients | | | | |
| Polymeg* 650 | 12.0 | 15.0 | — | — |
| Polymeg* 2000 | — | — | 7.0 | 10.0 |
| ERL-4221 | 73.5 | 70.9 | 77.8 | 75.2 |
| VCHM** | 12.0 | 11.6 | 12.7 | 12.3 |
| UVE-1014 | 2.0 | 2.0 | 2.0 | 2.0 |
| L-5410 | 0.5 | 0.5 | 0.5 | 0.5 |
| Dye* (pph) | 0.02 | 0.02 | 0.02 | 0.02 |
| Properties | | | | |
| Viscosity, cp | 85 | 80 | 115 | 114 |
| Temperature, °C. | 24 | 24 | 24 | 24 |

*See footnotes to Table I
**VCHM = 4-Vinyl cyclohexane monoepoxide

Coating/Cure Systems

Same as described in Table I, except a 1.5 minute removal time was used during the dip coating operation. Also, about ten minutes elapsed between the 50 fpm and 10 fpm UV cure passes. As a final cure, the PCB's were UV-cured for 15-20 seconds at a distance of one inch (height) or 1.5 inches (width) from a stationary light source. During cure, the relative humidity was 41% at 77° F.

RESULTS

Systems 4-7

All coatings on the steel panels were tack-free immediately after UV cure. The PCB's had a reasonable good appearance, but there were some flow lines and some build-up at the bottom of the board.

| Properties, One Day After Cure | Properties System, On Steel, No Post Cure | | | |
|---|---|---|---|---|
| | 4 | 5 | 6 | 7 |
| Acetone Double Rubs* | 100(1) | 100(1) | 100(1) | 100(1) |
| Pencil Hardness | 3H | 3H | 3H | 3H |
| % Crosshatch Adhesion | 95 | 90 | 95 | 99 |
| Conical Mandrel** | 20 mm | 2 mm | Fail | Fail |
| Gardner Impact | | | | |
| Face, in lbs. | 25 | 25 | 25 | 25 |
| Reverse, in lbs. | <5 | <5 | <5 | <5 |

*3 hours after UV exposure.
**ASTM D-522-60; failure indicates failure along entire length. A distance indicates length of failure from ⅛ inch end.

| System on PCB* | Thickness, mil | Electrical Resistance (500 v impressed), ohm × 10⁻¹² | | | | |
|---|---|---|---|---|---|---|
| | | Time After UV Cure | | | After 30 min. | |
| | | 1 hr. | 2 hr. | 3 da. | at 120° C. | at 140° C. |
| 4A | 2 | 8.0 | 9.0 | 40 | — | — |
| 4B | 1.5 | 14 | — | — | >100 | — |
| 4C | 2 | 14 | — | — | — | >100 |
| 5A | 3 | 9.5 | 11 | >100 | — | — |
| 5B | 2 | 6.1 | — | — | >100 | — |
| 5C | 2 | 6.0 | — | — | — | >100 |
| 6A | 2 | 18 | 30 | >100 | — | — |
| 6B | 2 | 16 | — | — | >100 | — |
| 6C | 2 | 14 | — | — | — | >100 |
| 7A | 2 | 13 | 14 | >100 | — | — |
| 7B | 2.5 | 18 | — | — | >100 | — |
| 7C | 3 | 14 | — | — | — | >100 |

*NOTE: Triplicate PCB's were prepared from each coating system. One board was aged under ambient conditions ("A"), and the other two were post-cured for 30 minutes at 120° C. ("B") or at 140C ("C").

| System on PCB* | PCB After 3 Days at RT | Electrical Resistance (500 v impressed), ohm × 10⁻¹² | | | | See Comment Below |
|---|---|---|---|---|---|---|
| | | 1 Hr. After 1 Hr. in | | No. of Days at RT After Solvent Testing | | |
| | | MeOH** | H₂O** | 4 Days | 6 Days | |
| 4A | 40 | — | — | 30 | 40 | — |
| 4B | >100 | — | 0.12 | >100 | 50 | — |
| 4C | >100 | 1.02 | — | 40 | 35 | (d) |
| 5A | >100 | — | — | 30 | 30 | — |
| 5B | >100 | — | 0.40 | >100 | >100 | — |
| 5C | >100 | 0.11 | — | >100 | >100 | — |
| 6A | >100 | — | — | >100 | >100 | (b) |
| 6B | >100 | — | 1.70 | >100 | >100 | (c) |
| 6C | >100 | 1.10 | — | >100 | >100 | — |
| 7A | >100 | — | — | >100 | >100 | (a) |
| 7B | >100 | — | 0.70 | 50 | 70 | — |
| 7C | >100 | 0.65 | — | >100 | >100 | — |

*"A" designates no thermal post cure.
"B" designates 30 minutes, 120° C. post cure.
"C" designates 30 minutes, 140° C. post cure.
**Samples were subjected to the refluxing solvent in a Soxhlet extractor that was modified so the PCB did not contact the liquid-condensed vapor. In effect, they were subjected to a 100% RH, condensing liquid environment for one hour. After this time, they were removed, allowed to cool to room temperature for an hour, and then the resistance was measured. There was no change in appearance after this exposure.

Comments:

(a) Subjected to 8 hours of condensing water vapor in Soxhlet extractor (temperature near board 90°-95° C.).

Resistance 1 minute after removal = $1.9 \times 10^8$ ohm. Resistance at 16 hours later = $3.0 \times 10^{12}$ ohm. Various areas on the board had blisters.

(b) Subjected to 6 hours of condensing water vapor, PCB then allowed to cool to RT in condensation chamber. It was then removed, dried with a paper towel, and resistance at 100 v was found to be $1.5 \times 10^{10}$ ohm. The PCB was then allowed to air-dry at RT for 1.5 hours and the resistance was determined at 100 volts to be $4.0 \times 10^{10}$. There were various areas on the back of the board that exhibited blisters.

(c) This board, which had been post-cured at 120° C. for 30 minutes, was treated in the same manner as the sample above except for slight difference in the times involved. Times and results are as follows:

Time in Soxhlet = 6.5 hours
Resistance at RT (room temperature) one minute after removal = $3.0 \times 10^{12}$ ohms at 100 v
Resistance after 1 hour at RT = $8.0 \times 10^{12}$ ohms at 500 v
Resistance after 18 hours at RT = $4.0 \times 10^{13}$ ohms at 500 v This board contained a few blisters but a markedly smaller number than the two boards above which were not thermally post-cured.

(d) This board, which had been post-cured at 140° C. for 30 minutes, was treated in the same manner as (c) above. Results are as follows:

Time in Soxhlet = 6.0 hours
Resistance at RT one minute after removal = $4.05 \times 10^{12}$ ohms at 100 v
Resistance after 1 hour at RT = $1.0 \times 10^{13}$ ohms at 500 v
Resistance after 18 hours at RT = $4.0 \times 10^{13}$ ohms at 500 v No blisters were apparent on this board.

GLOSSARY OF MATERIALS USED IN THE EXAMPLES

1. Polymeg 650 is a dihydroxy functional poly(tetramethylene oxide)polyol having an average molecular weight of 650, an average hydroxyl number of 160–187 and is available from Quaker Oats Company.

2. Polymeg 1000 is a dihydroxy functional poly(tetramethylene oxide)polyol having an average molecular weight of 1000, an average hydroxyl number of 107–118 and is commercially available from Quaker Oats Company as Polymeg 1000.

3. Polymeg 2000 is a dihydroxy functional poly(tetramethylene oxide)polyol having an average molecular weight of 2000, an average hydroxyl number of 53–59 and is commercially available from Quaker Oats Company.

4. UVE-1014 is a solution of an onium salt which is believed to contain hexafluoroantimony. It is listed as having a specific gravity of 1.39 and a Brookfield viscosity of 74 cp at 25° C. It is available from General Electric Company.

5. FC-171 is a fluorinated alkyl ester of the nonionic-type surfactant and is commercially available from 3M Co., Commercial Chemicals Division.

6. Calcafluor White RWP is a fluorescent dye of unknown composition and is available from American Cyanamid Co.

7. L-5410 is a silicone-ethylene oxide copolymer surfactant having the following structure and is available from Union Carbide Corporation.

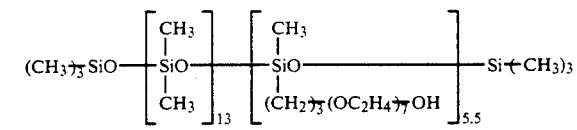

8. VCHM is 4-vinyl cyclohexane monoepoxide.

9. ERL-4221 is 3,4-epoxycyclohexylmethyl 3,4-epoxycyclohexane carboxylate.

10. TERATHANE 1000 is a dihydroxyl functional polytetramethylene oxide polyol having an average molecular weight of from 950 to 1050 and an average hydroxyl number of 107–118 and is available from E. I. duPont de Nemours & Co. (Inc.).

11. TERATHANE 2900 is a dihydroxyl functional polytetramethylene oxide polyol having an average molecular weight of from 2825 to 2975 and an average hydroxyl number of 37–40 and is available from E. I. duPont de Nemours & Co. (Inc.).

12. ERL-4299 is bis(3,4-epoxycyclohexylmethyl) adipate.

13. ERL-4206 is vinyl cyclohexene dioxide.

14. ERL-4234 is 2-(3,4-epoxycyclohexyl-5,5-spiro-3,4-epoxy) cyclohexane-meta-dioxane.

Table III is divided into a series of examples. All examples had a viscosity that was readily amenable to dip coating (which was used) or to spray coating. The examples cured well using the cure schedules described. The cured coatings rapidly developed good solvent resistance and hardness. When Polymeg polyols were used, crosshatch adhesion was variable and only fair on the metal substrates. However, all coatings passed the conical mandrel bend on tin plate, which is the test substrate required by Method 2011 of Fed. Test Std. 141.

As described in the next section of Table III, the thickness of the coatings on the PCB's was within the $2 \pm 1$ mil requirement. Also 20 minutes after UV exposure, all coated panels had a 500-volt resistance of $> 2.5 \times 10^{12}$ ohms. When the PCB's were maintained at room temperature, the resistance increased as a function of time. The post cure at 120° C. for 30 minutes yielded coatings with an electrical resistance of $> 1 \times 10^{14}$ ohms.

The last portion of Table III contains the resistance values obtained after the boards were subjected to 90°–95° C. condensing humidity conditions in the Soxhlet extraction chamber that was described in Examples 1-3. The standard for resistance after the board has been subjected to the humid environment and cooled to 25° C. is $> 1 \times 10^{10}$ ohms. One day later, the standard resistance was $\geq 2.5 \times 10^{12}$ ohms. From the data in this last section, it is readily apparent that the PCB's meet and surpass the requirements of this aspect of the Mil. Spec. Even the boards that were cured only under ambient conditions, after the UV exposure, met the specifications. However, two of the nonthermally treated boards and one of the thermally post-cured boards developed tiny blisters within the coating. On one of the ambient-cured boards, there were a relatively large number of blisters—about 15% of the area on one side had them. The other ambient-cured board had only about 5% of one side with a blistered area. The post-cured board had only a few of these irregularities, and one could not be certain they were caused during the high-humidity exposure or if they existed before exposure. Improper cleaning may have been responsible for the irregularities.

EXAMPLES 8-12

The general mixing procedure was used in the proportions given in Table III.

TABLE III

| | Polymeg/Epoxide Systems UV Cure | | | | |
|---|---|---|---|---|---|
| | Example | | | | |
| | 8 | 9 | 10 | 11 | 12 |
| Ingredients | | | | | |
| Polymeg* 650 | 18.0 | 20.0 | — | — | 12.0 |
| Polymeg* 1000 | — | — | 10.0 | 12.0 | — |
| Polymeg* 2000 | — | — | — | — | 3.0 |
| ERL-4221 | 68.4 | 66.6 | 75.2 | 73.5 | 70.9 |
| VCHM | 11.1 | 10.9 | 12.3 | 12.0 | 11.6 |
| UVE-1014 | 2.0 | 2.0 | 2.0 | 2.0 | 2.0 |
| L-5410 | 0.5 | 0.5 | *0.5 | 0.5 | 0.5 |
| Dye** (pph) | 0.02 | 0.02 | 0.02 | 0.02 | 0.02 |
| Properties | | | | | |
| Viscosity, cp | 89 | 87 | 90 | 97 | 86 |
| Temperature, °C. | 23.5 | 23.5 | 23.5 | 24.0 | 24.0 |

*Trademark for poly(tetramethylene oxide)polyols (Quaker Oats)
**Fluorescent dye, Calcafluor White RWP (American Cyanamid)

Coating/Cure System:

It was necessary to melt the Polymeg 1000 and 2000 to effect solution. The systems were coated onto Bonderite 37 Steel and Q-Panel Type DT tin-plate panels and onto fiberglass/epoxy printed circuit board (PCB) test panels. The steel panels were coated with a No. 20 wire-wound rod and the PCB's by a dip coating technique using a 3-minute removal time. During cure, the relative humidity was 19% and the temperature was 81° F. Cure rate for the steel panels was 10 fpm under a focused beam, 300 w/i, Type A, Fusion Systems light source. PCB's that meet Mil-I-46058C 1982, were cured on each side at a rate of 50 fpm and then twice on each side at 10 fpm. About 10 minutes elapsed between the 50 fpm and 10 fpm UV-cure passes. As a final cure, the PCB's were UV-cured for 30 seconds at a distance of 2 inches from a stationary, UV-light source.

RESULTS

Examples 8-12 on steel:

All coatings were tack-free, smooth, and had high gloss immediately after UV exposure. Thickness: 0.70–0.75 mil.

Examples 8-12 on PCB's:

All coatings were tack-free after the 50 fpm exposure. Thickness is given in the following table.

| Properties, One Day After Cure | Properties Examples, On Bonderite 37, No Post Cure | | | | |
|---|---|---|---|---|---|
| | 8 | 9 | 10 | 11 | 12 |
| Acetone Double Rubs | 100(1) | 100(1) | 100(1) | 100(1) | 100(1) |
| Pencil Hardness | 2H | 2H | 2H | H | H |
| % Crosshatch Adhesion | 15 | 50 | 5 | 25 | 30 |
| Conical Mandrel | Pass | Pass | 1 cm | 3 cm | Pass |
| Conical Mandrel* | Pass | Pass | Pass | Pass | Pass |
| Gardner Impact | | | | | |
| Face, in lbs. | 25 | 25 | 25 | 25 | 25 |
| Reverse, in lbs. | <5 | <5 | <5 | <5 | <5 |

*Conical Mandrel on tin-plated steel that meets Fed. Test Std. 141, Method 2011

| System on PCB* | Thickness, mils | Electrical Resistance 500 v, ohm × $10^{-12}$ | | |
|---|---|---|---|---|
| | | Time After UV Cure | | After 30 min. at 120° C. |
| | | 20 min. | 3 days | |
| 8A | 1.5 | 20 | 30 | — |
| 8B | 1.25 | 20 | — | >100 |
| 9A | 2.0 | 14 | 30 | — |
| 9B | 1.5 | 20 | — | >100 |
| 10A | 1.5 | 30 | 75 | — |
| 10B | 1.5 | 30 | — | >100 |
| 11A | 1.5 | 14 | 35 | — |
| 11B | 2.0 | 30 | — | >100 |
| 12A | 1.5 | 40 | 40 | — |
| 12B | 2.0 | 30 | — | >100 |

*NOTE: Duplicate PCB's were prepared from each coating system. One board was aged under ambient conditions ("A"), and the other board was post-cured for 30 minutes at 120° C.

| System on PCB* | Hours in Soxhlet | Electrical Resistance After Soxhlet Exposure (Examples 8-12), ohm × $10^{-12}$ | | | Blisters |
|---|---|---|---|---|---|
| | | Immediate, 100 Volts | 1 Hour 500 Volts | 1 Day,* 500 Volts | |
| Standard | — | 0.010** | — | 2.5 | None |
| 8A | 6.0 | 0.011 | 0.21 | 5.5 | None |
| 9A | 4.0 | 0.014 | 3.80 | 75 | None |
| 10A | 6.0 | 0.165 | 2.00 | 75 | Yes |
| 11A | 6.0 | 0.121 | 0.90 | 14 | Yes, Few |
| 12A | 6.0 | 4.0 | 12.0 | 50 | None |
| 8B | 6.5 | 6.5 | 30 | 75 | None |
| 9B | 6.0 | 6.0 | 25 | >100 | None |
| 10B | 6.0 | 7.0 | 10 | 50 | None |
| 11B | 6.0 | 0.017 | 0.46 | 75 | Yes, Few |
| 12B | 6.0 | 1.2 | 18 | 75 | None |

*The resistance of the boards was checked several days (times varied from 11 to 4 days) after the first exposure to the Soxhlet "enviroment". When measured at 500 volts, all the PCB's had a resistance of >1 × $10^{14}$ ohms.
**Average value required. Individual specimens can have a value as low as 0.005 × $10^{12}$ ohms.

The PCB's that met Mil-I-46058C 1982 were coated by using a dip coating technique and a 3-minute removal time. UV cure was effected by curing the boards on each side at a rate of 50 fpm and then twice on each side at 10 fpm. The Fusion Systems, focused beam, 300 w/i, Type A light source was used. The PCB's were then UV-cured on each edge for 30 seconds at a distance of two inches from a stationary light source (Canrad-Hanovia 673A10, 105475). Four PCB's were prepared from each system and one of each of these was treated as follows:

Designation A—No post cure.
Designation B—Post cured on each flat side for 30 seconds at a distance of two inches from the stationary UV source.
Designation C—80° C. thermal post cure for 30 minutes.
Designation D—120° C. thermal post cure for 30 minutes.

Thermal shock testing was carried out using test condition B-2 of Method 107F of Mil. Std. 202F. This test method requires passage of fifty cycles that involve the following conditions. The test PCB's are subjected to a −65° C. temperature (acetone/dry ice bath) for 30 minutes. After this time, the specimens are removed and placed in a 125° C. oven for 30 minutes. Transfer time between the low and high temperature was less than five minutes. After five cycles were completed, from time to time the test was interrupted and the PCB's were allowed to return to room temperature. That is, such interruption took place at the end of the work day. This is in accord with Method 107F. After 50 cycles, all PCB's were examined with a ten-power lens. Except for one PCB, no damage (cracks, blisters, loss of gloss, etc.) of any type was noted. The one exception (Example 9C) had a number of minute cracks that appeared to be in the PCB rather than in the coating. As indicated below, the electrical resistance before and after humidity testing was markedly above specification requirements.

Table IV contains the electrical resistance values obtained at 500 v for the PCB's before, during, and after the thermal shock testing. It is apparent that 15 minutes after UV exposure the coatings all were above the specification resistance of $2.5 \times 10^{12}$ ohms, and those coatings thermally post-cured at 120° C. for 30 minutes were beyond the range of the resistance measuring instrument. Periodically—i.e., before each new day's series of cycles—the resistance was measured during the thermal shock cycling.

At the completion of the fifty thermal shock cycles, the PCB's were subjected to six hours of 90°–95° C., condensing humidity conditions in the accelerated testing, Soxhlet extraction chamber that has been previously described. After this time, the resistance of all PCB's was more than two orders of magnitude greater than the specification standard of $1 \times 10^{10}$ ohms at 100 volts. One day later, all PCB's had a resistance of $>1 \times 10^{14}$ ohms at 500 volts versus a standard requirement of $2.5 \times 10^{12}$ ohms.

Examples 9 and 11 were coated onto tin plate that met the Mil. Spec. requirement and then UV cured. After 24 hours aging under ambient conditions, all coated panels were subjected to the ⅛-inch Mandrel bend test and all coatings passed.

the test substrate required by Method 2011 of Fed. Test Std. 141.

As described in the next section of Table V, the thickness of the coatings on the PCB's was within the 2±1 mil requirement. Also an hour after UV exposure, all coated panels except for one had a 500-volt resistance of $>2.5 \times 10^{12}$ ohms. When the PCB's were maintained at room temperature, the resistance increased as a function of time.

The last portion of Table V contains the resistance values obtained after the boards were subjected to 90°–95° C. condensing humidity conditions in the Soxhlet extraction chamber that was described in Examples 1–3. The standard for resistance after the board has been subjected to the humid environment and cooled to 25° C. was $\geq 1 \times 10^{10}$ ohms. One day later, the standard resistance was $\geq 2.5 \times 10^{12}$ ohms. From the data in this last section, it is readily apparent that the PCB's meet and surpass the requirements of this aspect of the Mil. Spec.

TABLE V

| | Polymeg/Epoxide Systems UV Cure | | | | |
|---|---|---|---|---|---|
| | Example | | | | |
| | 13 | 14 | 15 | 16 | 17 |
| Ingredients | | | | | |
| Polymeg* 650 | 24.0 | 30.0 | — | — | — |
| Polymeg* 1000 | — | — | 16.0 | 20.0 | — |
| Polymeg* 2000 | — | — | — | — | 14.0 |
| ERL-4221 | 63.2 | 58.0 | 70.1 | 66.6 | 71.8 |
| VCHM | 10.3 | 9.5 | 11.4 | 10.9 | 11.7 |
| UVE-1014 | 2.0 | 2.0 | 2.0 | 2.0 | 2.0 |
| L-5410 | 0.5 | 0.5 | 0.5 | 0.5 | 0.5 |
| Dye** (pph) | 0.02 | 0.02 | 0.02 | 0.02 | 0.02 |
| Properties | | | | | |
| Viscosity, cp | 124 | 155 | 155 | 166 | 220 |
| Temperature, °C. | 25.1 | 25.0 | 25.0 | 25.0 | 25.0 |

*Trademark for poly(tetramethylene oxide)polyols (Quaker Oats)
**Fluorescent dye, Calcafluor White RWP (American Cyanamid)

TABLE IV

| | Properties of Selected Conformal Coatings Before and After Thermal Shock (TS) Cycling (50 Cycles) | | | | | | | |
|---|---|---|---|---|---|---|---|---|
| | Example 9 | | | | Example 11 | | | |
| Designation | A | B | C | D | A | B | C | D |
| Coating thickness, mils | 1.50 | 1.50 | 1.50 | 1.00 | 1.25 | 1.50 | 1.25 | 1.50 |
| | Electrical Res., ohm × $10^{-12}$ | | | | | | | |
| 15 minutes after UV cure | 11.0 | 5.5 | 8.0 | 7.0 | 11.0 | 16.0 | 16.0 | 12.0 |
| After post-cure | — | 11.0 | 20.0 | >100 | — | 50.0 | 40.0 | >100 |
| After 1 day | 7.5 | 9.5 | 18.5 | >100 | 16.5 | 40.0 | 35.0 | >100 |
| After 7 TS cycles | >100 | >100 | >100 | >100 | >100 | >100 | >100 | >100 |
| After 15 TS cycles | >100 | >100 | >100 | >100 | >100 | >100 | >100 | >100 |
| After 24 TS cycles | >100 | >100 | >100 | >100 | >100 | >100 | >100 | >100 |
| After 32 TS cycles | >100 | >100 | >100 | >100 | >100 | >100 | >100 | >100 |
| After 41 TS cycles | >100 | >100 | >100 | >100 | >100 | >100 | >100 | >100 |
| After 40 TS cycles | >100 | >100 | >100 | >100 | >100 | >100 | >100 | >100 |
| After 6 hours Accelerated humidity testing | | | | | | | | |
| Immediate (100 v) | 2.5 | 1.1 | 6.0 | 12.0 | 4.0 | 8.0 | 6.1 | 5.5 |
| After 1.5 hrs at RT (500 v) | 11.0 | 12.0 | 12.0 | 50.0 | 16.0 | 30.0 | 40.0 | 11.0 |
| After 1.4 da at RT (500 v) | >100 | >100 | >100 | >100 | >100 | >100 | >100 | >100 |

EXAMPLES 13–17

The general procedure for mixing was used.

Table V is divided into a series of segments. The first segment contains the formulation systems. All systems had a viscosity that was readily amenable to dip coating (which was used). The systems cured well using the cure schedules described. The cured coatings rapidly developed good solvent resistance and hardness. Cross-hatch adhesion was variable. In certain cases, excellent adhesion to Bonderite 37 was obtained. All coatings passed the ⅛-inch mandrel bend on tin plate, which is Coating/Cure System:

It was necessary to melt the Polymeg 1000 and 2000 to effect solution. The systems were coated onto Bonderite 37 Steel and Q-Panel Type DT tin-plate panels and onto fiberglass/epoxy printed circuit board (PCB) test panels. The steel panels were coated with a No. 20 wire-wound rod and the PCB's by a dip coating technique using a 3-minute removal time. During cure, the relative humidity was 33% and the temperature was 76° F. Cure rate for the steel panels was 10 fpm under a focused beam, 300 w/i, Type A, fusion Systems light source. PCB's that meet Mil-I-46058C 1982, were cleaned, dried, and cured on each side at a rate of 50 fpm and then twice on each side at 10 fpm. About 10 minutes elapsed between the 50 fpm and 10 fpm UV-cure passes. As a final cure, the PCB's were UV-cured for 30 seconds at a distance of 2 inches from a stationary, medium-pressure, UV-light source (Hanovia 673A10, 105475).

RESULTS

Examples 13-17 on Steel and Tin Plate:
All coatings were tack-free, smooth, and had high gloss immediately after UV exposure. Thickness: 0.70–0.75 mil.

Examples 13-17 on PCB's:
All coatings were tack-free after the 50 fpm exposures. Thickness is given in the following table.

Properties

| Properties 72 Hours After UV Exposure | 13 | 14 | 15 | 16 | 17 |
|---|---|---|---|---|---|
| Examples, On Bonderite 37, No Post Cure | | | | | |
| Acetone Double Rubs | 100(1) | 60(4) | 100(1) | 100(1) | 100(1) |
| Pencil Hardness | H | H | 3H | 2H | 3H |
| % Crosshatch Adhesion | 100 | 100 | 100 | 80 | 100 |
| Gardner Impact | | | | | |
| Face, in lbs. | 275 | >320 | 25 | 100 | 25 |
| Reverse, in lbs. | 300 | >320 | 15 | 75 | >5 |
| Thickness, mils | 0.80 | 0.70 | 0.70 | 0.78 | 0.75 |
| Examples, On Tin Plate, No Post Cure | | | | | |
| Acetone Double Rubs | 15(4) | 30(4) | 100(1) | 100(1) | 100(1) |
| Pencil Hardness | F | F | H | F | F |
| % Crosshatch Adhesion | 0 | 12 | 0 | 0 | 0 |
| ⅛" Mandrel Bend | Pass | Pass | Pass | Pass | Pass |
| Thickness, mils | 0.70 | 0.70 | 0.70 | 0.75 | 0.70 |

| | | Electrical Resistance 500 v, ohm × $10^{-12}$ Time After UV Cure | | |
|---|---|---|---|---|
| System on PCB | Thickness, mils | 60 min. | 1 day | 7 Days* |
| 13 | 1.50 | 2.75 | 6.0 | 6.5 |
| 14 | 1.75 | 0.21 | 0.64 | 1.2 |
| 15 | 1.25 | 9.5 | 18.0 | 12.0 |
| 16 | 1.50 | 7.0 | 18.0 | 11.0 |
| 17 | 1.00 | 1.2 | 25.0 | 40.0 |

*Resistance value just before accelerated humidity testing.

Electrical Resistance After Soxhlet Exposure, ohm × $10^{-12}$

| System on PCB* | Hours in Soxhlet | Immediate, 100 Volts | 1 Hour 500 Volts | 1 Day,* 500 Volts | Blisters |
|---|---|---|---|---|---|
| Standard | — | 0.010** | — | 2.5 | None |
| 13 | 6.0 | 0.022 | 4.6 | 40 | None |
| 14 | 6.0 | 3.4 | 11.0 | 21 | None |
| 15 | 6.0 | 3.6 | 6.5 | 35 | None |
| 16 | 6.0 | 0.013 | 2.2 | >100 | None |
| 17 | 6.0 | 3.4 | 5.5 | 40 | None |

*The resistance of the boards was checked several days (times varied from 11 to 4 days) after the first exposure to the Soxhlet "environment". When measured at 500 volts, all the PCB's had a resistance of $>1 \times 10^{14}$ ohms.
**Average value required. Individual specimens can have a value as low as 0.005 × $10^{12}$ ohms.

EXAMPLES 18-23

Examples 18 through 25 delineated in Table VI were designed to contain large amounts of polyol.

Examples 24 and 25 were included as examples of polyol combinations. All properties were very good for these systems with one exception. Example 25 failed the accelerated humidity testing. This was unexpected and no explanation can be given for this failure.

TABLE VI

| | Polymeg/Epoxide Systems UV Cure | | | | | | | |
|---|---|---|---|---|---|---|---|---|
| | Examples | | | | | | | |
| | 18 | 19 | 20 | 21 | 22 | 23 | 24 | 25 |
| Ingredients, g | | | | | | | | |
| Polymeg* 650 | 35.0 | 45.0 | — | — | — | — | 10.0 | 10.0 |
| Polymeg* 1000 | — | — | 30.0 | 40.0 | — | — | 8.0 | 6.0 |
| Polymeg* 2000 | — | — | — | — | 20.0 | 30.0 | — | 3.0 |
| ERL-4221 | 53.7 | 45.1 | 58.0 | 49.5 | 66.6 | 58.0 | 68.4 | 67.5 |
| VCHM | 8.8 | 7.4 | 9.5 | 8.0 | 10.9 | 9.5 | 11.1 | 11.0 |
| UVE-1014 | 2.0 | 2.0 | 2.0 | 2.0 | 2.0 | 2.0 | 2.0 | 2.0 |
| L-5410 | 0.50 | 0.50 | 0.50 | 0.50 | 0.50 | 0.50 | 0.50 | 0.50 |
| Dye,** pph | 0.02 | 0.02 | 0.02 | 0.02 | 0.02 | 0.02 | 0.02 | 0.02 |
| Properties | | | | | | | | |
| Viscosity***, cp | 137 | 160 | 197 | 241 | 265 | 395 | 127 | 141 |

*Trademark for poly(tetramethylene oxide)polyols (Quaker Oats).
**Fluorescent dye, Calcafluor White RWP (American Cyanamid).
***At 25° C., UK LV8 viscometer, L-6 spindle.

Coating/Cure System:
It was necessary to melt the Polymeg 1000 and 2000 to effect solution. The systems were coated onto Bonderite 37 Steel and Q-Panel-Type DT tin-plate panels and onto fiberglass/epoxy printed circuit board (PCB) test panels. The steel panels were coated with a No. 20 wire-wound rod and the PCB's by a dip coating technique using a 3.5 to 4-minute removal time. During cure, the relative humidity was 29% and the temperature was 74° F. Cure rate for the steel panels was 10 fpm under a focused beam, 300 w/i, Type A, Fusion Systems light source. PCB's that met Mil-I-46058C 1982, were cleaned, dried, and cured on each side at a rate of 50 fpm and then twice on each side at 10 fpm. About 10 minutes elapsed between the 50 fpm and 10 fpm UV-cure passes. As a final cure, the PCB's were UV-cured on all four edges for 30 seconds at a distance of 2 inches from a stationary, medium-pressure, UV-light source (Hanovia 673A10, 105475).

RESULTS

Examples 18-25 on Steel and Tin Plate:
All coatings were tack-free, smooth, and had high gloss when warm immediately after UV exposure.

Examples 18-25 on PCB's:
All coatings were tack-free after the 50 fpm exposure.

| Properties 24 Hours after UV Exposure | 18 | 19 | 20 | 21 | 22 | 23 | 24 | 25 |
|---|---|---|---|---|---|---|---|---|
| Examples on Bonderite 37, No Post Cure | | | | | | | | |
| Acetone Dbl. Rubs | 94(4) | 15(4) | 90(4) | 33(4) | 100(1) | 40(4) | 100(1) | 100(1) |
| Pencil Hardness | H | H | H | H | H | H | 4H | 4H |
| % X-Hatch Adh. | 100 | 100 | 100 | 100 | 100 | 100 | 60 | 40 |
| Gardner Impact | | | | | | | | |
| Direct, in. lbs. | >320 | >320 | >320 | >320 | 25 | 250 | 15 | 25 |
| Reverse, in. lbs. | >320 | >320 | >320 | >320 | 25 | 225 | <5 | <5 |
| Thickness, mils | 0.78 | 0.65 | 0.78 | 0.78 | 0.62 | 0.80 | 0.70 | 0.70 |
| Examples on Tin Plate (Q Panel, Type DT) | | | | | | | | |
| Acetone Dbl. Rubs | 33(4) | 12(4) | 39(4) | 15(4) | 100(1) | 20(4) | 100(1) | 100(1) |
| Pencil Hardness | H | H | H | H | H | H | H | H |
| % X-Hatch Adh. | 0 | 50 | 0 | 0 | 0 | 20 | 0 | 0 |
| ⅛ in. Mandrel Bend | Pass | Pass | Pass | Pass | Pass | Pass | Pass | Pass |
| Thickness, mils | 0.72 | 0.45 | 0.65 | 0.68 | 0.70 | 0.75 | 0.65 | 0.62 |
| Examples on Bonderite 37, 10 Min. 80° C. Post Cure | | | | | | | | |
| Acetone Dbl. Rubs | 100(1) | 30(4) | 100(1) | 60(4) | 100(1) | 100(1) | 100(1) | 100(1) |
| Pencil Hardness | 2 H | H | 2 H | H | 3 H | 2 H | 4 H | 4 H |
| % X-Hatch Adh. | 100 | 100 | 100 | 100 | 100 | 100 | 100 | 100 |
| Example on Tin Plate, 10 Min. 80° C. Post Cure | | | | | | | | |
| Acetone Dbl. Rubs | 50(4) | 25(4) | 48(4) | 26(4) | 100(1) | 60(4) | 100(1) | 100(1) |
| Pencil Hardness | H | H | H | H | H | H | H | H |
| % X-Hatch Adh. | 0 | 0 | 0 | 0 | 0 | 0 | 0 | 0 |
| Example on Bonderite, 10 Min. at 80° C. and at 70° C. | | | | | | | | |
| Acetone Dbl. Rubs | — | 100(1) | — | 100(1) | — | — | — | — |
| Pencil Hardness | — | H | — | H | — | — | — | — |
| % X-Hatch Adh. | — | 100 | — | 100 | — | — | — | — |
| Example on Tin Plate, 10 Min. at 80° C. and at 70° C. | | | | | | | | |
| Acetone Dbl. Rubs | 100(1) | 75(4) | 100(1) | 40(4) | — | 100(1) | — | — |
| Pencil Hardness | H | H | H | H | — | H | — | — |
| % X-Hatch Adh. | 50 | 100 | 100 | 100 | — | 100 | — | — |

| | | Insulation Resistance, 500 v ohm $\times 10^{-12}$ | | |
|---|---|---|---|---|
| Example on PCB | Thickness, Mils | Time After UV Exposure | | |
| | | 16 Hrs | 2 Days | 3 Days |
| 18 | 1.7 | 0.065 | 0.090 | 0.017 |
| 19* | 1.7 | 0.005 | 0.006 | 0.002 |
| 20 | 1.7 | 0.396 | 0.550 | 0.024 |
| 21 | 2.0 | 0.040 | 0.065 | 0.006 |
| 22 | 2.0 | 6.50 | 8.00 | 5.50 |
| 23 | 2.2 | 0.33 | 0.42 | 0.90 |
| 24 | 1.5 | 14.0 | 17.0 | 14.0 |
| 25 | 1.5 | 12.0 | 20.0 | 14.0 |

| | | Insulation Resistance After Soxhlet Exposure, ohm $\times 10^{-12}$ | | |
|---|---|---|---|---|
| Example on PCB | Hours in Soxhlet | Immediate, 100 v | After 1.5 Hr. 500 V | After 12 Hr. 500 V |
| Standard | — | 0.010 | — | 2.5 |
| 18 | 6.0 | 0.00009 | 0.0015 | 0.011 |
| 19 | 6.0 | 0.021 | 0.245 | 0.210 |
| 20 | 6.0 | 0.00025 | 0.0033 | 1.85 |
| 21 | 6.0 | 0.034 | 1.20 | 20.0 |
| 22 | 6.0 | 4.10 | 6.50 | 25.0 |
| 23 | 6.0 | 0.00050 | 0.028 | 0.99 |
| 24 | 6.0 | 4.00 | 11.0 | 40.0 |
| 25 | 6.0 | 0.0028 | 0.45 | 11.0 |

*This coating had a high frictional, rubbery feel.

EXAMPLES 26–32

These Examples contain data for formulations based on poly(tetramethylene oxide)polyols and different epoxide compositions. They have a relatively high viscosity and they meet the military specification requirements. These systems did not pass the ⅛-inch Mandrel bend requirement.

TABLE VII

Polymeg/Epoxide Systems
UV Cure

| Ingredients, g | Examples | | | | | | |
|---|---|---|---|---|---|---|---|
| | 26 | 27 | 28 | 29 | 30 | 31 | 32 |
| Polymeg* 1000 | 12.0 | 12.0 | 12.0 | 16.0 | 16.0 | 25.0 | 15.0 |
| Polymeg* 2000 | — | — | — | — | — | — | 10.0 |
| ERL-4221 | 85.5 | 85.5 | 79.9 | 81.5 | 75.9 | 72.5 | 72.5 |
| VCHM | — | — | 5.6 | — | 5.6 | — | — |
| UVE-1014 | 2.0 | 2.0 | 2.0 | 2.0 | 2.0 | 2.0 | 2.0 |
| L-5410 | 0.50 | 0.50 | 0.50 | 0.50 | 0.50 | 0.50 | 0.50 |

TABLE VII-continued

Polymeg/Epoxide Systems
UV Cure

| Dye,** pph | 0.02 | 0.02 | 0.02 | 0.02 | 0.02 | 0.02 | 0.02 |
|---|---|---|---|---|---|---|---|
| Properties |  |  |  |  |  |  |  |
| Viscosity***, cp | 297 | 277 | 189 | 306 | 200 | 281 | 371 |

Properties

| Properties 24 Hours After UV Exposure | 26 | 27 | 28 | 29 | 30 | 31 | 32 |
|---|---|---|---|---|---|---|---|
| Examples on Bonderite 37, No Post Cure ||||||||
| Double Acetone Rubs | 100(1) | 100(1) | 100(1) | 100(1) | 100(1) | 40(4) | 40(4) |
| Pencil Hardness | H | H | H | H | H | — | — |
| % X-Hatch Adhesion | 0 | 0 | 0 | 0 | 0 | — | — |
| Gardner Impact |  |  |  |  |  |  |  |
| Direct, in. lbs. | 25 | 50 | 25 | 25 | 25 | — | — |
| Reverse, in. lbs. | <5 | <5 | <5 | <5 | <5 | — | — |
| Examples on Tin Plate (Type DT), No Post Cure ||||||||
| Double Acetone Rubs | 100(1) | 100(1) | 100(1) | 100(1) | 100(1) | 30(4) | 40(4) |
| Pencil Hardness | H | H | H | H | H | — | — |
| % X-Hatch Adhesion | 0 | 0 | 0 | 0 | 0 | — | — |
| Mandrel Bend, ⅛-in | Fail | Fail | Fail | Fail | Fail | — | — |
| Examples on Bonderite, 30 Min. at 120° C. ||||||||
| Double Acetone Rubs | — | — | — | — | — | 100(1) | 100(1) |
| Pencil Hardness | — | — | — | — | — | H | H |
| % X-Hatch Adhesion | — | — | — | — | — | 100 | 100 |
| Gardner Impact |  |  |  |  |  |  |  |
| Direct, in. lbs. | — | — | — | — | — | 250 | 250 |
| Reverse, in. lbs. | — | — | — | — | — | 150 | 150 |
| Examples on Tin Plate (Type DT), 30 Min. at 120° C. ||||||||
| Double Acetone Rubs | — | — | — | — | — | 100(1) | 100(1) |
| Pencil Hardness | — | — | — | — | — | H | H |
| % X-Hatch Adhesion | — | — | — | — | — | 5 | 5 |
| Mandrel Bend, ⅛-in | — | — | — | — | — | Pass | Pass |

*Trademark for poly(tetramethylene oxide)polyols (Quaker Oats).
**Fluorescent dye. Calcafluor White RWP (American Cyanamid).
***Note: Viscosity data at 30° C., UK LV8 viscometer, L-6 spindle.

Coating/Cure System:
Same procedure used. RH was 37% at 75° F. during cure.

RESULTS

Examples 26–32
All systems were tack-free when warm immediately after UV exposure.

| Insulation Resistance,* ohms × $10^{-12}$, at 500 volts (Times are elapsed time after UV exposure) ||||||
|---|---|---|---|---|---|
| System on PCB | Thickness Mils | 1 Hr. | 16 Hrs. | 1 Day | 2 Days | Post Cure 30 Min at 120° C. |
| 26 | 1.5 | — | 7.5 | — | 5.9 | — |
| 27 | 2.0 | 20.0 | — | 12.0 | — | — |
| 28 | 2.0 | — | 11.0 | — | 8.0 | — |
| 29 | 2.0 | — | 5.0 | — | 3.5 | — |
| 30 | 2.0 | — | 15.0 | — | 12.0 | — |
| 31 | 3.0 | 2.0 | — | 0.72 | — | — |
| 31 | 2.8 | — | — | — | — | 50.0 |
| 32 | 2.0 | 3.2 | — | 1.5 | — | — |
| 32 | 2.5 | — | — | — | — | 40.0 |

| Insulation Resistance After Soxhlet Exposure, ohm × $10^{-12}$ |||||
|---|---|---|---|---|
| Example on PCB | Hours in Soxhlet | Immediate, 100 V | After 1-2 Hr. 500 V | After 1 Day, 500 V |
| Standard | — | 0.010 | — | 2.5 |
| 26 | 6 | 0.0001 | 0.0042 | 12.0 |
| 27 | 6 | 0.42 | 1.2 | 15.0 |
| 28 | 6 | 0.16 | 0.65 | 4.1 |
| 29 | 6 | 0.19 | 0.70 | 25.0 |
| 30 | 6 | 0.0002 | 0.0011 | 6.4 |
| 31 | 6 | 0.0002 | — | 0.090 |
| 31* | 6 | 0.0065 | — | 18.0 |
| 32 | 6 | 0.0003 | 0.025 | 0.23 |
| 32* | 6 | 0.0034 | 6.50 | 14.0 |

*Mil Spec standard 2.5 × $10^{12}$ ohms.
*Post cured 30 Min. at 120° C.

EXAMPLES 33–39

These examples contain data for conforml coating formulations based on tetramethylene oxide polyols from a different source and on a variety of epoxides. Each formulation contained 2.0 grams of UVE-1014 photoinitiator, 0.5 gram of L-7604 surfactant, and 0.02 gram of Calcafluor White RWP fluorescent dye. All examples were mixed as previously described.

TABLE VIII

Poly(tetramethylene oxide) Polyol/Epoxide Systems
UV Cure

| | Example Nos. |||||||
|---|---|---|---|---|---|---|---|
| Ingredients, g | 33 | 34 | 35 | 36 | 37 | 38 | 39 |
| TERATHANE 1000 | 12.0 | — | — | — | 14.0 | 14.2 | 14.0 |
| TERATHANE 2900 | — | 5.0 | 10.0 | 15.0 | — | — | — |
| ERL-4221 | 73.5 | 79.5 | 75.2 | 70.5 | 64.9 | 64.9 | 64.9 |
| ERL-4299 | — | — | — | — | 8.0 | — | — |
| ERL-4206 | — | — | — | — | — | 8.0 | — |
| ERL-4234 | — | — | — | — | — | — | 8.0 |
| VCHM | 12.0 | 13.0 | 12.3 | 11.5 | 10.6 | 10.6 | 10.6 |
| Viscosity, cp, at 25° C. | 132 | 145 | 212 | 312 | 156 | 105 | 173 |

Coating/Cure System:
Same procedure as used in other examples was employed.

RESULTS

All system were tack-free when warm immediately after UV exposure. All coatings except that from Example 39 passed the ⅛-inch mandrel bend test on tin plated steel (Q Panel, Type D1).

All coatings had a Gardner impact resistance test value of <5 in. direct and 25 in. lbs. reverse.

| Properties 24 hrs. After UV Exposure On Bonderite Steel | Examples | | | | | | |
|---|---|---|---|---|---|---|---|
|  | 33 | 34 | 35 | 36 | 37 | 38 | 39 |
| Acetone Double Rubs | 100(1) | 100(1) | 100(1) | 100(1) | 100(1) | 100(1) | 100(1) |
| Pencil Hardness | H | 2H | 2H | 2H | 2H | 3H | 3H |
| Insulation Resistance, ohms × $10^{-12}$ at 500 volts on PCB 15 min. after UV exposure | 2.5 | 4.4 | 3.4 | 2.3 | 1.3 | 1.3 | 1.3 |

EXAMPLES 40 and 41

These examples describe the use of an inert solvent in the formulation. After the formulations were coated onto the substrates, no drying step was used. That is, they were coated and cured in the same manner as was described in the previous examples. Both coatings were tack-free when warm immediately after UV exposure. Coatings from both examples passed the ⅛-inch mandrel bend test on tin-plated steel.

|  | EXAMPLES | |
|---|---|---|
|  | 40 | 41 |
| Ingredients, g |  |  |
| Formulation of Ex. 33 | 8.0 | — |
| Formulation of Ex. 36 | — | 8.0 |
| 1,1,1-trichloroethane | 2.0 | — |
| UCAR PM Acetate | — | 2.0 |
| Properties |  |  |
| Double Acetone Rubs | 100(1) | 68(4) |
| Pencil Hardness | H | 2 B |
| Cross Hatch Adhesion | 100% | 100% |
| Gardner Impact, in. lbs |  |  |
| Direct | 25 | <5 |
| Reverse | >320 | >320 |

Although the invention was described in its preferred forms with a certain degree of particularity, it will be appreciated by those skilled in the art that variations may be made without departing from the spirit and scope of the invention.

What is claimed is:

1. A photocurable composition consisting essentially of a cycloaliphatic polyepoxide, a poly(tetramethylene oxide)polyol, and a photoinitiator, the cured product of said composition being moisture resistant and having an electrical insulation resistance of greater than about $2.5 \times 10^{12}$ ohms.

2. The cured product of the composition defined in claim 1.

3. A photocurable composition consisting essentially of a cycloaliphatic diepoxide in an amount of about 60 to about 89 parts by weight, a poly(tetramethylene oxide)polyol in an amount of about 10 to about 35 parts by weight and an onium photoinitiator in an amount of about 1 to about 5 parts by weight, the cured product of said composition being moisture resistant and having an electrical insulation resistance of greater than about $2.5 \times 10^{12}$ ohms.

4. A composition as defined in claim 3 wherein said diepoxide is 3,4-epoxycyclohexylmethyl 3,4-epoxycyclohexane carboxylate.

5. A composition as defined in claim 3 wherein said diepoxide is bis(3,4-epoxycyclohexylmethyl) adipate.

6. A composition as defined in claim 3 wherein said diepoxide is 2-(3,4-epoxycyclohexyl-5,5-spiro 3,4-epoxy)cyclohexane-meta-dioxane.

7. A composition as defined in claim 3 wherein said diepoxide is a mixture of 3,4-epoxycyclohexylmethyl 3,4-epoxycyclohexane carboxylate, bis(3,4-epoxycyclohexylmethyl) adipate and 2-(3,4-epoxycyclohexyl-5,5-spiro 3,4-epoxy)cyclohexane-meta-dioxane.

8. A composition as defined in claim 3 wherein said polyol has a molecular weight of 600 to 3,000.

9. A composition as defined in claim 3 wherein said composition contains a reactive monoepoxide diluent.

10. A composition as defined in claim 9 wherein said diluent is vinyl cyclohexene monoepoxide.

11. A composition as defined in claim 3 wherein said photoinitiator is a hexafluoroantimonate salt.

12. A composition as defined in claim 11 wherein said salt is an aryl sulfonium hexafluoroantimonate salt.

13. A composition as defined in claim 3 wherein said composition contains a silicone-ethylene oxide copolymer surfactant having the formula:

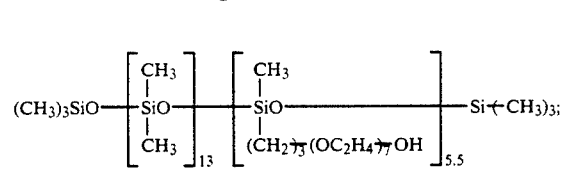

said surfactant being present in an amount of about 0.05 to about 1.0 percent.

14. A composition as defined in claim 3 wherein said composition contains a fluorescent dye.

15. A photocurable composition as defined in claim 2 consisting essentially of 3,4-epoxycyclohexylmethyl 3,4-epoxycyclohexane carboxylate, a dihydroxy functional (tetramethylene oxide)polyol having a molecular weight of about 1,000, an onium salt photoinitiator, and a silicone-ethylene oxide copolymer surfactant having the formula:

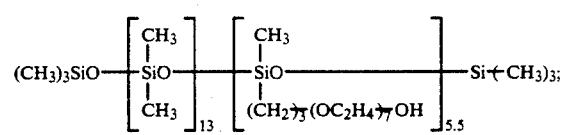

said surfactant being present in an amount of about 0.05 to about 1.0 percent.

16. A photocurable composition consisting essentially of a cycloaliphatic polyepoxide, a poly(tetramethylene oxide)polyol, a surfactant and a photoinitiator, the cured product of said composition being moisture resistant and having an electrical insulation resistance greater than about $2.5 \times 10^{12}$ ohms.

* * * * *